(12) United States Patent
Arase et al.

(10) Patent No.: US 8,766,158 B2
(45) Date of Patent: Jul. 1, 2014

(54) PRODUCTION METHOD OF MICROLENS

(75) Inventors: Shinya Arase, Funabashi (JP); Takahiro Sakaguchi, Funabashi (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 203 days.

(21) Appl. No.: 13/574,897

(22) PCT Filed: Jan. 20, 2011

(86) PCT No.: PCT/JP2011/050976
§ 371 (c)(1),
(2), (4) Date: Jul. 24, 2012

(87) PCT Pub. No.: WO2011/090115
PCT Pub. Date: Jul. 28, 2011

(65) Prior Publication Data
US 2012/0298842 A1 Nov. 29, 2012

(30) Foreign Application Priority Data

Jan. 25, 2010 (JP) ................................. 2010-012853

(51) Int. Cl.
*H01L 27/00* (2006.01)
*H01J 3/14* (2006.01)
*G03F 1/00* (2012.01)
*G02B 23/24* (2006.01)

(52) U.S. Cl.
USPC ............. 250/208.1; 250/216; 430/5; 359/362

(58) Field of Classification Search
CPC ........... G03F 7/20; H01L 27/146; G02B 3/00; B28B 7/34
USPC ........... 359/19, 288, 290, 355, 366, 642–651, 359/362, 364, 365, 503; 250/208.1, 216, 250/239; 430/8, 2, 5
See application file for complete search history.

(56) References Cited

U.S. PATENT DOCUMENTS 6,420,073 B1 * 7/2002 Suleski et al. .................... 430/5
8,097,890 B2 * 1/2012 Qian et al. ....................... 257/98

FOREIGN PATENT DOCUMENTS

| JP | A-2000-332226 | 11/2000 |
| JP | A-2006-278356 | 10/2006 |
| JP | A-2007-53318 | 3/2007 |
| JP | A-2008-522245 | 6/2008 |
| JP | A-2009-59959 | 3/2009 |

(Continued)

OTHER PUBLICATIONS

May 10, 2011 International Search Report issued in Patent Application No. PCT/JP2011/050976 (with translation).

(Continued)

*Primary Examiner* — Que T Le
*Assistant Examiner* — Don Williams
(74) *Attorney, Agent, or Firm* — Oliff PLC

(57) ABSTRACT

A production method of a solid-state imaging device in which microlenses are arranged adjacent to each other on a substrate, includes: a first process of forming first microlenses on a surface of the substrate leaving space therebetween for providing second microlenses; and a second process of applying an overcoating material onto the surface of the substrate on which the first microlenses are formed, drying the overcoating material, exposing the overcoating material to light using a gray scale mask, and developing the exposed overcoating material, so as to form second microlenses in the space between the first microlenses adjacent to each other.

7 Claims, 2 Drawing Sheets

(56) References Cited

FOREIGN PATENT DOCUMENTS

| JP | A-2009-130017 | 6/2009 |
| JP | A-2009-198547 | 9/2009 |
| JP | A-2009-294624 | 12/2009 |

OTHER PUBLICATIONS

May 10, 2011 English Translation of the Written Opinion of the International Searching Authority issued in Patent Application No. PCT/JP2011/050976.

* cited by examiner

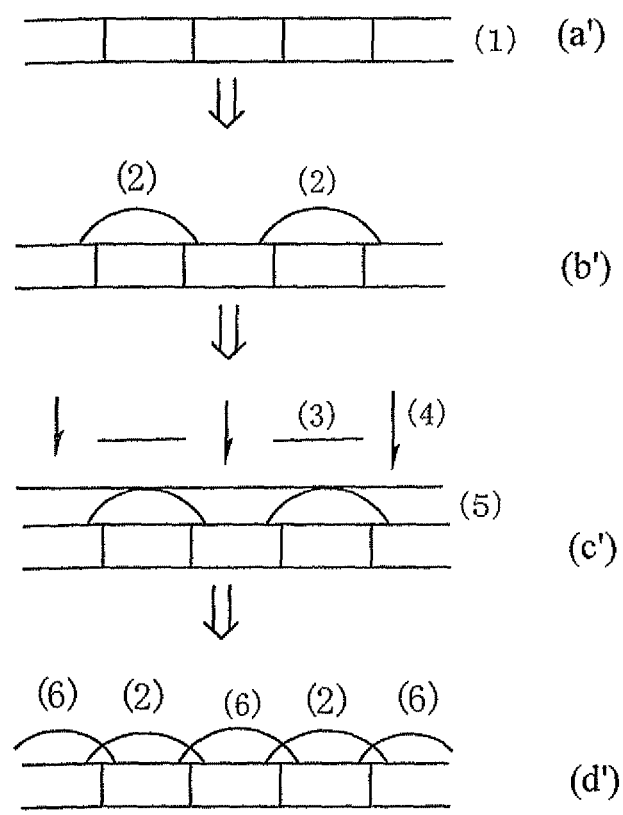

PRODUCTION METHOD OF MICROLENS

TECHNICAL FIELD

The present invention relates to a solid-state imaging device equipped with microlenses and a production method thereof.

BACKGROUND ART

As a forming method of microlenses on a substrate, various methods are studied.

As a first method, there is a well-known method (melt method) including: forming a photosensitive thermoplastic resin layer for lenses on a color filter for light receivers of an image sensor; exposing the resin layer to light using a photomask having a predetermined pattern and developing the resin layer to form a columnar resist pattern layer at a position corresponding to each light receiver; and subjecting the resist pattern layer to a heating treatment at a softening point of the thermoplastic resin or more so as to cause the resin to flow, so that the resin droops at edges of the pattern layer to form convex lenses.

As a second method, there is a known method (etch back method) including: forming a photosensitive resist film on a planarized resin layer for lenses on an image sensor; exposing the resist film to light using a photomask having a predetermined pattern and developing the resist film to form a columnar resist pattern layer at a position corresponding to each light receiver; subjecting the resist pattern layer to a heating treatment at a softening point of the resist or more so as to cause the resin to flow, so that the resin droops at edges of the pattern layer to form convex-lens shapes; and etching back the resin layer for lenses using the convex-lens shapes as an etching mask to remove the resist film and simultaneously to form lenses in the resin layer for lenses.

As a third method, there is a known method (gray scale method) including: forming a photosensitive curable resin layer for lenses on a color filter for light receivers; and exposing the resin layer to light through a gray scale mask for controlling the distribution of a transmitted light volume during the exposure depending on the distribution state of fine patterns incapable of being resolved at an exposure wavelength and developing the resin layer to directly form a lens pattern layer at a position corresponding to each light receiver.

When the first method of the related art is used, the pattern layer of the photosensitive thermoplastic resin for lenses is heated to flow to provide convex-lens shapes. Therefore, during the heating-to-flow process, a fusion is caused between the lenses adjacent to each other, which becomes a cause of the lowering of the yield. If the distance between the lenses is set large in order to prevent this, the yield is improved. However, a problem occurs that the performance of an image sensor degrades, because a gap is caused between the lenses and this leads to the lowering of the aperture ratio.

The second method also has a heating-to-flow process, so it has risks similar to the first method. Furthermore, the etch back process is essential to the second method, so that facilities such as a reactive ion etching apparatus are necessary and the process becomes lengthened. Accordingly, a defect during the etch back newly occurs, which affects the yield of the lens formation.

The third method is advantageous for shortening the process and making the aperture ratio high. However, following the reduction of the pixel size, it is difficult to exactly transfer a photomask pattern to a resist with the third method.

As a fourth method, there is a known method (melt method) including: transferring a resist pattern in a plaid pattern to a resin layer on a substrate for preventing a fusion between the lenses adjacent to each other; causing the resin layer to flow by heating and temporarily curing the resin layer; and forming a new resist pattern layer in a part having no pattern, causing the resist pattern layer to flow by heating, and curing the resist pattern layer. There is reported that microlenses having small gaps between the lenses can be formed by this method. However, even by this method, the gap between the lenses adjacent to each other cannot be eliminated. Furthermore, there is such a problem that a microlens array shape with an overlap between the lenses and a high aperture ratio, which is regarded as ideal for the collection efficiency, cannot be obtained.

Meanwhile, there is a method for coating the surfaces of microlenses with an overcoating layer (see Patent Document 1 and Patent Document 2). The method includes: forming the microlenses on a substrate; applying thereon an overcoating material to form the overcoating layer using lithography; and reflowing.

In addition, there is a method (see Patent Document 3) for forming a structure in which the surface of a microlens is coated with an overcoating layer. The method includes: coating the surfaces of microlenses with an overcoating material; exposing the overcoating material to light using the gray scale mask; and developing the overcoating material.

RELATED-ART DOCUMENTS

Patent Documents

Patent Document 1: Japanese Patent Application Publication No. JP-A-2009-059959
Patent Document 2: Japanese Patent Application Publication No. JP-A-2009-130017
Patent Document 3: Japanese Patent Application Publication No. JP-A-2006-278356

SUMMARY OF THE INVENTION

Problem to be Solved by the Invention

It is an object of the present invention to provide: a solid-state imaging device excellent in eliminating gaps between the lenses adjacent to each other during the microlens formation and forming an overlap structure between the lenses, excellent in lens curvature controlling property, and having a high effective sensitivity by enhancing microlens formation stability; and a production method thereof.

Means for Solving the Problem

The present invention provides, as a first aspect, a production method of a solid-state imaging device in which microlenses are arranged adjacent to each other on a substrate, the method including:

a first process of forming first microlenses on a surface of the substrate leaving space therebetween for providing second microlenses; and a second process of applying an overcoating material onto the surface of the substrate on which the first microlenses are formed, drying the overcoating material, exposing the overcoating material to light using a gray scale mask, and developing the exposed overcoating material, so as to form second microlenses in the space between the first microlenses adjacent to each other;

as a second aspect, the production method according to the first aspect further including an operation of heating the second microlenses at a temperature that is the softening point temperature of the second microlenses or less after the exposure in the second process;

as a third aspect, the production method according to the first aspect or the second aspect in which the second microlenses are formed so that overlapping portions are formed in which peripheries of the first microlenses and peripheries of the second microlenses are overlapped with each other;

as a fourth aspect, the production method according to any one of the first aspect to the third aspect in which the first microlenses and the second microlenses are circular microlenses and the largest width of the overlapping portions is 1 to 85% of a radius of the circular microlenses;

as a fifth aspect, the production method according to any one of the first aspect to the forth aspect in which the first microlenses and the second microlenses have components different from each other;

as a sixth aspect, the production method according to any one of the first aspect to the fourth aspect in which the first microlenses and the second microlenses have an identical component; and as a seventh aspect, a solid-state imaging device including microlenses produced by the method as described in any one of the first aspect to the sixth aspect.

Effects of the Invention

By the production method of the solid-state imaging device of the present invention, a microlens array can be reliably formed, in which an overlapping structure is formed between the microlenses adjacent to each other without a gap and the curvature viewed from a two-dimensional direction is homogeneous. Therefore, the collection efficiency can be enhanced. By performing the forming process of the second microlenses by a method using the gray scale mask, the second microlenses can be formed without impairing a joining shape between the lenses adjacent to each other. This enables formation of a microlens array having a shape that is difficult to be formed by a conventional method.

The first microlenses have already been formed in a plaid pattern on a substrate, and in space adjacent to the first microlenses, a material for forming the second microlenses is applied onto the substrate surface on which the first microlenses have been formed. Even when a liquid material is applied onto the solid first microlenses, the second microlenses can be formed without causing intermixing. For forming the second microlenses, a reflow method for heating at a temperature that is a softening point temperature of the microlens or more is not used. Therefore, no fusion of the second microlenses with the first microlenses is caused and microlenses having an ideal shape (the cross-sectional shape between the lenses is a V-shape) can be formed. This is because the second microlenses are formed using the gray scale mask, which does not require a reflow process in which the microlenses are heated to a temperature that is a softening point temperature of the microlens or more, and the microlenses can be cured at a temperature that is a softening point temperature of the microlenses or less.

The second microlenses are formed using the gray scale mask, so that the microlenses can be formed in a desired shape. With this, the microlenses adjacent to each other share the peripheries thereof, so that a microlens array having a small gap and high collection efficiency can be formed on the substrate.

In a method for forming the microlenses at once using the gray scale mask from the beginning which is regarded as one of the conventional techniques, an interference of light during the exposure is caused between the microlenses adjacent to each other and the cross-sectional shape between the microlenses adjacent to each other is formed in a U-shape structure rather than a V-shape structure. Therefore, the collection efficiency between the lenses decreases.

In the present invention, after the first microlenses are formed (first process), the substrate surface is coated with an overcoating material and the resultant coating is dried, followed by performing exposure through the gray scale mask (second process). Thus, an interference of light does not occur between the first microlenses and the second microlenses that are adjacent to each other, and the cross-sectional shape between the microlenses adjacent to each other is formed in a V-shape structure rather than a U-shape structure. Therefore, the collection efficiency satisfactorily increases.

This allows the solid-state imaging device having the microlenses produced by the production method of the present invention to have a high effective sensitivity.

BRIEF DESCRIPTION OF THE DRAWINGS

FIG. 1 FIG. 1A is a schematic view of a planar structure of a substrate observed from above before a composition for forming first microlenses is applied onto the substrate. FIG. 1B is a schematic view, observed from above, of a planar structure of the substrate on which microlenses are formed through the first process. FIG. 1C is a schematic view, observed from above, of a planar structure of the substrate, wherein an overcoating material for forming second microlenses is applied onto the substrate on which the first microlenses are formed and the resultant coating is subjected to exposure and development. FIG. 1D is a schematic view, observed from above, of a planar structure of the substrate on which the microlenses are formed through the first process and the second process.

FIG. 2 FIG. 2A' is a schematic view, observed from the side, of a cross-sectional structure of the substrate before the composition for forming the first microlenses is applied onto the substrate. FIG. 2B' is a schematic view, observed from the side, of a cross-sectional structure of the substrate on which the microlenses are formed through the first process. FIG. 2C' is a view, observed from the side, of the substrate in a cross-sectional structure, wherein the overcoating material for forming the second microlenses is applied onto the substrate and the resultant coating is subjected to exposure and development. FIG. 2D' is a schematic view, observed from the side, of a cross-sectional structure of the substrate on which the microlenses are formed through the first process and the second process.

MODES FOR CARRYING OUT THE INVENTION

Figure 1:
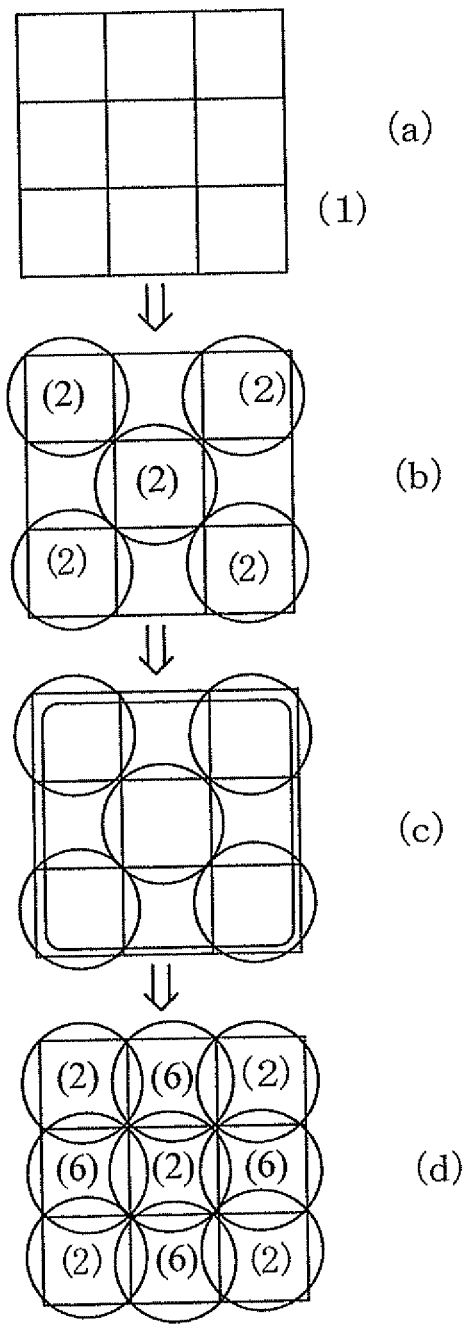

The present invention relates to a production method of a solid-state imaging device in which microlenses are arranged adjacent to each other on a substrate, the method including:

a first process of forming first microlenses on the surface of the substrate leaving space therebetween for providing second microlenses; and a second process of applying an overcoating material onto the surface of the substrate on which the first microlenses are formed, drying the overcoating material, exposing the overcoating material to light using a gray scale mask, and developing the exposed overcoating material, so as to form second microlenses in the space between the first microlenses adjacent to each other.

As the composition for forming the first microlenses used in the first process in the present invention, typical microlens forming compositions can be used.

Examples of these compositions include: positive resist compositions (1) using a vinyl-based compound or derivatives thereof, containing if necessary, a thermally crosslinkable polymer produced by copolymerizing acrylic acid, an acrylic acid ester, or the like and a sensitizer such as naphthoquinone diazide, and capable of containing if desired, a crosslinker; and positive resist compositions (2) using a novolac-based resin or a hydroxystyrene-based resin, containing if necessary, a thermally crosslinkable polymer produced by copolymerizing acrylic acid, an acrylic acid ester, or the like and a sensitizer such as naphthoquinone diazide, and capable of containing if desired, a crosslinker.

Examples of the combination of the thermally crosslinkable thermal crosslinkage forming groups include a combination of a functional group (1) such as a carboxy group and a hydroxy group with a functional group (2) such as an epoxy group, an oxetane group, an isocyanate group, and an alkoxy group, and by a reaction of the functional group (1) with the functional group (2), a thermal crosslinkage is generated.

In the present invention, when the composition contains a thermally crosslinkable polymer and a sensitizer, a thermal crosslinkage is generated between a polymer containing the functional group (1) and a polymer containing the functional group (2). When the composition contains a thermally crosslinkable polymer, a sensitizer, and a crosslinker, any one of the polymer and the crosslinker has the functional group (1) and the other has the functional group (2) and then, between the polymer and the crosslinker, the thermal crosslinkage is generated.

The first microlenses can be formed by any one method of a melt method, an etch back method, and a gray scale method.

Onto a glass substrate, a silicon wafer, or a substrate coated with an oxide film, a nitride film, or a metal such as aluminum, molybdenum, and chromium, a composition for forming the first microlenses is applied by rotation coating, flow coating, roll coating, slit coating, slit coating followed by rotation coating, inkjet coating, or the like. The application is performed, for example, by a spin coating method. The spin coating can be performed at a rotation speed of 500 to 4,000 rpm. The film thickness of the coating liquid can be set, for example, at 0.1 to 3.0 µm. Then, the resultant coating is dried by heating at a temperature of 50 to 130° C., and the coating is exposed to light using a pattern mask. The pattern masking is performed using a mask having a mask pattern (so-called plaid pattern) for forming space in which the first microlenses can be arranged and space in which the second microlenses can be arranged such that these pieces of space are alternately arranged. Each of the first microlenses usually has a diameter of 1.0 to 3.0 µm and is formed, for example, in a hemisphere shape having a diameter of around 1.7 µm and a height of 0.5 to 1.0 µm. The space surrounded by the first microlenses for forming the second microlens adjacent to the first microlenses is similar to the space in which the first microlens is formed.

As the overcoating material for forming the second microlenses which is applied onto the substrate after the first microlenses are formed, a usual microlens forming composition can be used and the positive resist composition can also be used. The overcoating material may be produced as either the same composition as or a different composition from the first microlens forming composition.

Onto the surface of the substrate on which the first microlens pattern is formed, the overcoating material for forming the second microlenses is applied. The overcoating material for forming the second microlenses can be applied by rotation coating, slit coating, slit coating followed by rotation coating, or an inkjet coating method. The film thickness of the applied overcoating material for forming the second microlenses may be around the same as the height of the first microlenses or more.

After the application of the overcoating material, the exposure is performed using the gray scale mask.

In the mask pattern formed in the gray scale mask (gradation mask), the light blocking effect becomes higher from the edge toward the center in the microlens portion, so that the microlens portion is subjected to inclined-exposure from the edge toward the center. The light blocking effect is controlled mainly by the concentration of a light blocking metal (such as chromium). When a positive resist composition is used as the overcoating material, the exposure amount becomes low at the center portion of the formed microlens pattern and high at the edge portion of the microlens pattern, so that a microlens in a hemisphere shape is formed.

The second microlenses are formed in space between the first microlenses. In the production method of the present invention, the first microlenses and the second microlenses may have overlapping portions in which the peripheries of the first microlenses and the second microlenses are overlapped with each other, so that the diameter of the microlenses can be enlarged. As a result, the collection efficiency is enhanced. For example, when both the first microlenses and the second microlenses are in a circular shape having a diameter of 1.7 µm, the largest width of the overlapping portions in which the peripheries thereof are overlapped with each other can be set at 0.15 µm.

The width of the overlapping portion can be set at 1 to 85%, or 1 to 60%, or 1 to 50% of the radius of the microlens.

Here, when the microlenses are not in a circular shape, the radius of the microlenses means the radius of approximate circles of the microlenses and the width of the overlapping portions in which the peripheries are overlapped with each other means the largest width of the overlapping portions on the radius of the approximate circles.

In the present invention, for forming the second microlenses between the first microlenses, the substrate, onto which the overcoating material is applied, is exposed to light using the gray scale mask, is developed with a developer, and then, can be subjected to PEB (Post Exposure Bake). However, even when PEB is performed, the baking is not performed at a temperature at which the material reflows (temperature of the softening point or more).

When the baking is performed in multiple stages (for example, two stages) in the processes of forming microlenses, it is possible to cure the overcoating material while causing a crosslinking reaction at a temperature of the softening point or less in the first baking, accomplish the curing to a degree by which the material does not reflow in the following second baking, and then, subject the material to the second baking. Due to the formation of the crosslinkage, the softening point temperature of the microlens itself is elevated to a temperature higher than the softening point temperature before the first baking. It becomes thus possible to perform the second baking at a temperature higher than the softening point temperature before the first baking without the reflow of the microlens. That is, in the forming process of the microlens, there is satisfied the relationship of (temperature for first baking)<(temperature for second baking)<(softening point temperature of microlens after first baking). The first baking is achieved usually for 0.5 to 20 minutes. The second baking is achieved usually for 0.5 to 20 minutes.

The second microlenses are formed by the gray scale method, so that the formation of the second microlenses does not need the reflow process. Therefore, in the formation of the second microlenses, the cross-sectional shape between the microlenses adjacent to each other maintains a V-shape, so that the lens curvature of the second microlenses can be maintained at constant and the collection efficiency of the second microlenses is enhanced.

By developing the second microlenses with an alkaline developer after the exposure, an exposed portion is washed out and a relief pattern having a sharp edge face can be obtained. The developer used here is not particularly limited as long as the developer is an alkaline aqueous solution. Specific examples thereof include: an aqueous solution of an alkali metal hydroxide such as potassium hydroxide, sodium hydroxide, potassium carbonate, and sodium carbonate; an aqueous solution of a quaternary ammonium hydroxide such as tetramethylammonium hydroxide, tetraethylammonium hydroxide, and choline; and an aqueous solution of an amine such as ethanolamine, propylamine, and ethylenediamine.

The alkaline developer is generally 10% by mass or less aqueous solution, preferably 0.1 to 3.0% by mass aqueous solution. Furthermore, to the above developers, alcohols or a surfactant may be added for use in a content of preferably 0.05 to 10 parts by mass relative to 100 parts by mass of the developer.

Among these developers, 0.10 to 2.38% by mass aqueous solution of tetramethylammonium hydroxide is generally used as a developer for the photoresist and the coating film composed of the microlens forming composition and the overcoating material which is used in the present invention can be developed using this solution without causing a problem such as swelling.

As the developing method, any of a paddle method, a dynamic dispense method, a dipping method, and a shaking-immersion method may be used. Here, the developing time is usually 15 to 180 seconds. After the development, washing by running water is performed for 20 to 90 seconds and then, moisture on the substrate is removed by air-drying with compressed air, compressed nitrogen, or spinning. Thus, a patterned coating film is obtained. Then, the whole surface of the patterned coating film is irradiated with a light such as an ultraviolet ray using a high pressure mercury lamp to perfectly decompose a sensitizer component (1,2-naphthoquinone diazide compound) remaining in the patterned coating film, so that transparency of the coating film is enhanced.

Thus, an objective cured film having an advantageous pattern shape can be obtained. This cured film is excellent in heat resistance, solvent resistance, and transparency and can preferably be applied to, besides the microlens, an interlayer insulation film, various insulation films, various protective films, and the like.

EXAMPLES

Next, the present invention is described with reference to the drawings. The drawings are schematic views of a planar structure and a cross-sectional structure illustrating the production process of a microlens array which is an example of the present invention. In Examples, a substrate having a color filter in which the unit pixel pitch has a size of 2.0 µm was used.

Example 1

As a first process, a coating film (softening point temperature of the coating film was 170° C.) formed by applying a thermocurable microlens forming composition onto a substrate was exposed to light through a gray scale mask and was developed to form a pattern that becomes the first microlenses (FIG. 1B and FIG. 2B'). Here, the pattern films were formed in a plaid pattern on a color filter. Next, by baking at 140° C. and further by baking at 180° C., the lens-shaped pattern films formed by the above exposure and development were cured. Each of the lens patterns had a diameter of 2.5 µm. Then, as a second process, on a part of the color filter in which pattern films were not formed in the first process, second lens-shaped pattern films were formed using the same thermocurable microlens forming composition as that in the first process through the gray scale mask in the same manner as in the first process. Next, baking of the pattern films at 140° C. for 5 minutes was performed to accomplish the curing accompanied by a crosslinking reaction. Further, by baking at 180° C. for 5 minutes, lens-shaped pattern films were formed. This procedure produced a microlens array in an ideal shape having a high lens opening ratio and having overlapping portions (width of the overlapping portion is 0.5 µm) between the lenses adjacent to each other.

Example 2

As a first process, on the same substrate as in Example 1, dot pattern films (first microlenses) were formed using a thermoplastic microlens forming composition (softening point temperature of the coating film composed of the composition was 120° C.) through a binary mask (FIG. 1B and FIG. 2B'). Here, the dot pattern films were formed in a plaid pattern on the color filter. Next, by a thermal treatment at 160° C., the above formed dot pattern films were heated to flow to form lens-shaped pattern films. Then, by baking of the pattern films at 200° C., the pattern films were cured. Each of the lens-shaped pattern films had a diameter of 2.5 µm. Then, as a second process, on a part of the color filter in which pattern films were not formed in the first process, second lens-shaped pattern films were formed using a thermocurable microlens forming composition that is different from the composition in the first process (softening point temperature of the coating film composed of the composition was 170° C.) through the gray scale mask in the same manner as in the first process. Next, baking of the pattern films at 140° C. for 5 minutes was performed to accomplish the curing accompanied by a crosslinking reaction. Further, by baking at 180° C. for 5 minutes, the lens-shaped pattern films were cured. This procedure produced a microlens array in an ideal shape having a high lens opening ratio and having overlapping portions (width of the overlapping portion was 0.5 µm) between the lenses adjacent to each other.

Comparative Example 1

As a first process, on the same substrate as in Example 1, dot pattern films (first microlenses) were formed using a thermoplastic microlens forming composition (softening point temperature of the coating film composed of the composition was 120° C.) through a binary mask (FIG. 1B and in FIG. 2B'). Here, the pattern films were formed in a plaid pattern on the color filter. Next, by a thermal treatment at 160° C., the above dot pattern films formed through the exposure were heated to flow to form lens-shaped pattern films. Then, by baking of the lens-shaped pattern films at 200° C., the lens-shaped pattern films were cured. Each of the lens-shaped pattern films had a diameter of 2.0 µm. Then, as a second process, on a part of the color filter in which pattern films were not formed in the first process, dot pattern films (second microlenses) having a diameter of 2.0 μm were formed using the same thermoplastic microlens forming composition as that in the first process through the binary mask in the same manner as in the first process. Next, baking of the pattern films at 160° C. for 5 minutes was performed to accomplish the curing accompanied by a crosslinking reaction. Further, by baking at 200° C. for 5 minutes, the lens-shaped pattern films were cured to form a microlens array having a gap of 0.2 μm between the lenses adjacent to each other. Each of the formed lenses had a curvature viewed from a two-dimensional direction which was not homogeneous and had a low lens opening ratio.

INDUSTRIAL APPLICABILITY

Microlenses are formed in two stages, and in the latter process, the microlenses are formed by a method using the gray scale. The gray scale method has no reflow process, so the shape between the microlenses adjacent to each other becomes an ideal shape (cross-sectional shape between the lenses is formed in a V-shape). Therefore, a solid-state imaging device having a high effective sensitivity can be obtained.

DESCRIPTION OF THE REFERENCE NUMERALS

In FIG. 1 and FIG. 2, (1) indicates a substrate, (2) indicates a first microlens, (3) indicates a gray scale mask (gradation mask) used for forming second microlenses, (4) indicates light (for example, ultraviolet ray) used for exposure, (5) indicates an overcoating material for forming the second microlenses, and (6) indicates a second microlense.

The invention claimed is:

1. A production method of a solid-state imaging device in which microlenses are arranged adjacent to each other on a substrate, the method comprising:
   a first process of forming first microlenses on a surface of the substrate leaving space therebetween for providing second microlenses; and
   a second process of applying an overcoating material onto the surface of the substrate on which the first microlenses are formed, drying the overcoating material, exposing the overcoating material to light using a gray scale mask, and developing the exposed overcoating material, so as to form second microlenses in the space between the first microlenses adjacent to each other.

2. The production method according to claim 1, further comprising an operation of heating the second microlenses at a temperature that is the softening point temperature of the second microlenses or less after the exposure in the second process.

3. The production method according to claim 1, wherein the second microlenses are formed so that overlapping portions are formed in which peripheries of the first microlenses and peripheries of the second microlenses are overlapped with each other.

4. The production method according to claim 1, wherein the first microlenses and the second microlenses are circular microlenses and the largest width of the overlapping portions is 1 to 85% of a radius of the circular microlenses.

5. The production method according to claim 1, wherein the first microlenses and the second microlenses have components different from each other.

6. The production method according to claim 1, wherein the first microlenses and the second microlenses have an identical component.

7. A solid-state imaging device comprising microlenses produced by the method as claimed in claim 1.

* * * * *